(12) United States Patent
Nakasuji

(10) Patent No.: US 6,429,441 B1
(45) Date of Patent: Aug. 6, 2002

(54) CHARGED-PARTICLE-BEAM MICROLITHOGRAPHY APPARATUS AND METHODS EXHIBITING VARIABLE BEAM VELOCITY, AND DEVICE-MANUFACTURING METHODS USING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/498,923

(22) Filed: Feb. 4, 2000

(30) Foreign Application Priority Data

Feb. 9, 1999 (JP) ............................. 11-031358

(51) Int. Cl.⁷ .................... H01J 37/30; H01J 37/145
(52) U.S. Cl. ................. 250/492.2; 250/397; 250/398
(58) Field of Search ..................... 250/492.2, 358, 250/397

(56) References Cited

U.S. PATENT DOCUMENTS

| | | | | |
|---|---|---|---|---|
| 4,766,372 A | * | 8/1988 | Rao | 250/396 ML |
| 5,376,792 A | * | 12/1994 | Schamber et al. | 250/396 ML |
| 5,567,949 A | | 10/1996 | Okino | 250/492.23 |
| 6,151,101 A | * | 11/2000 | Okino | 250/492.2 |
| 6,218,676 B1 | * | 4/2001 | Nakasuji | 250/492.2 |
| 2001/0008274 A1 | * | 7/2001 | Nakasuji | 250/492.2 |

OTHER PUBLICATIONS

Hosokawa, "Systematic Elimination of Third Order Aberrations in Electron Beam Scanning System," *Optick* 56:21–30 (1980).

Nakasuji et al., "Reduction Mechanism for Spherical and Chromatic Aberration Coefficients of Magnetic Lens and Retarding Electric Fields," *Jpn. J. Appl. Phys.* 32:4819–4825 (1993).

* cited by examiner

*Primary Examiner*—Bruce Anderson
(74) *Attorney, Agent, or Firm*—Klarquist Sparkman LLP

(57) ABSTRACT

Charged-particle-beam (CPB) microlithography apparatus and methods are disclosed that produce a beam-decelerating electric field and that achieve controlled reduction of aberrations parasitic to the beam-decelerating electric field. To such end, a representative embodiment of an apparatus comprises an illumination-optical system for illuminating a reticle defining a pattern to be transferred to a wafer, and a projection-optical system for projecting a charged particle beam, transmitted through the reticle, onto the wafer. The illumination-optical system and projection-optical system each include a respective liner tube. A beam-decelerating electric field (exhibiting a convex lens action) is provided between the reticle and the liner tube of the illumination-optical system, and a separate beam-decelerating electric field (exhibiting a concave lens action) is provided between the liner tube of the projection-optical system and the wafer. Aberrations caused by the convex lens action and aberrations caused by the concave lens action are at least partially cancelled by each other. Hence, aberrations parasitic to the decelerating electric fields are simply controlled.

33 Claims, 3 Drawing Sheets

CHARGED-PARTICLE-BEAM MICROLITHOGRAPHY APPARATUS AND METHODS EXHIBITING VARIABLE BEAM VELOCITY, AND DEVICE-MANUFACTURING METHODS USING SAME

FIELD OF THE INVENTION

The present invention relates to microlithography apparatus and methods using a charged particle beam. With such apparatus and methods, a pattern as defined on a mask or reticle is transferred to a sensitive substrate (e.g., semiconductor wafer) using a charged particle beam (e.g., electron beam or ion beam). The invention more specifically relates to such apparatus and methods in which the velocity of the charged particle beam incident to the sensitive substrate can be made different from the velocity of the charged particle beam incident to the reticle.

BACKGROUND OF THE INVENTION

In an ongoing effort to develop practical microlithography apparatus that can achieve better resolution than optical microlithography, microlithography using a charged particle beam (e.g., electron beam) has received much attention. However, a practical charged-particle-beam (CPB) microlithography system has not yet been realized due to many technical problems such as satisfactory aberration control and acceptable throughput (number of semiconductor wafers that can be processed microlithographically per unit time).

In a typical CPB microlithography system as exemplified by an electron-beam system, an "illumination beam" is produced by an electron gun and passed through multiple condenser lenses (constituting an "illumination-optical system") to illuminate a region on a reticle. The portion of the illumination beam passing through the reticle becomes a "patterned beam" that passes through multiple projection lenses (constituting a "projection-optical system") to form an image, on the wafer, of the illuminated region of the reticle.

Japanese Kokai (laid-open) patent document no. Hei 8-124834 discloses electron-beam microlithography apparatus in which a decelerating electric field is established between the reticle and the wafer (i.e., within the projection-optical system) to reduce the velocity of the charged particle beam incident to the wafer relative to the beam velocity incident to the reticle. Maintaining a relatively high beam velocity at the reticle reportedly yields better contrast and electron-beam transmission through the reticle, even when using a scattering contrast reticle. A relatively high beam velocity at the reticle also reportedly reduces electron absorption by the reticle (which reduces reticle heating due to electron absorption by the reticle) and reduces chromatic aberration. A relatively low beam velocity incident to the wafer reportedly helps prevent loss of resist sensitivity and reduces heating of the resist and of the wafer.

However, apparatus and methods according to JP 8-124834 pose the following problems:
(a) The beam-decelerating electric field is produced by imposing a high voltage to a "liner tube" in a lens of the projection-optical system. Application of such a high voltage to the liner tube produces a localized beam-decelerating electric field that produces a corresponding localized electrostatic lens action between the wafer and the liner tube (or between the wafer and a shield of the projection-optical system, as shown in FIG. 2 of that reference). The lens action generates a new aberration for which no corrective action is disclosed or contemplated by the reference.
(b) Application of a high voltage to a liner tube of a lens causes other problems leading to aberrations and beam blur. This reference provides no information on how to solve such problems or how to correct for aberrations arising from irregularities in the surface planarity of the wafer.

SUMMARY OF THE INVENTION

In view of the shortcomings of the prior art summarized above, the present invention was devised to achieve one or more of the following:
(1) In a simple manner, control parasitic aberrations arising from passing the charged particle beam through a beam-decelerating electric field.
(2) Provide the charged particle beam with high energy at the reticle using a relatively low-voltage power supply.
(3) Exploit a change in the beam half-angle of the charged particle beam within a projection lens and at the surface of the wafer that arises from subjecting the beam to a beam-decelerating electric field. For a particular beam half-angle, a relatively small beam half-angle in the lens yields reduced geometric aberrations and chromatic aberrations. (The reduction in chromatic aberration is especially pronounced.)
(4) Avoid problems with lenses of the projection-optical system that arise due to application of high voltage to the respective liner tubes.
(5) Achieve improved beam adjustment and registration.
(6) Avoid deleterious effects of a non-planar surface around the reticle and/or wafer.

To achieve the ends listed above, and according to a first aspect of the invention, charged-particle-beam (CPB) microlithography apparatus are provided. In such apparatus according to the invention, an illumination-optical system is configured and situated to illuminate an "illumination beam" onto a desired region on a reticle defining a pattern to be transferred to a sensitive substrate ("wafer"). A projection-optical system is configured and situated to project, onto a desired corresponding region on the wafer, a "patterned beam" created by passage of the illumination beam through the desired region on the reticle. A first beam-decelerating electric field is established between the reticle and the projection-optical system, and a second beam-decelerating electric field is established between the projection-optical system and the wafer. Aberrations arising from a convex lens action of the first beam-decelerating electric field and aberrations arising from a concave lens action of the second beam-decelerating electric field at least partially cancel each other. Thus, aberrations parasitic to the beam-decelerating electric fields are controlled relatively simply. (The lens actions of the first and second beam-decelerating electric fields can be opposite to what is described above.)

In a first representative embodiment of an apparatus according to the invention, the projection-optical system comprises a lens having a magnetic pole that is rotationally symmetric about an optical axis and an excitation coil. A liner tube is situated inside the inside diameter (ID) of the magnetic pole and its excitation coil. A first voltage (electrical potential) difference is imposed between the liner tube and the reticle, and a second potential difference is imposed between the liner tube and the wafer. These potential differences are utilized for forming the respective beam-decelerating electric fields.

In a second representative embodiment, an electron beam is used as the charged particle beam. The projection-optical system comprises a lens having a magnetic pole that is rotationally symmetric about the optical axis and an excitation coil. A first liner tube is situated inside the ID of the magnetic pole and its excitation coil. Similarly, the illumination-optical system comprises a lens having a magnetic pole that is rotationally symmetric about the optical axis and an excitation coil. A second liner tube is situated inside the ID of the magnetic pole and its excitation coil. A high negative voltage ($V_k$) is applied to a cathode of an electron gun (serving as the source of the electron beam), and a high positive voltage ($V_i$) is applied to the first liner tube (i.e., liner tube of the lens in the illumination-optical system). A high positive voltage ($V_m$), wherein $V_m \geq V_i$, is applied to the reticle; a positive voltage ($V_p$), wherein $V_p < V_i$, is applied to the second liner tube (i.e., liner tube of the lens in the projection-optical system). The wafer is either electrically grounded, or a voltage ($V_w$) is applied thereto, wherein $V_{w<Vp}$.

In the second representative embodiment, not only can a high acceleration voltage ($|V_k|+V_m$) be established between the cathode of the electron gun and the reticle, but also the respective absolute values of $V_k$ and $V_m$ can be kept low. Also, a first beam-decelerating electric field can be realized between the reticle and the second (projection-lens) liner tube ($V_m-V_p$), and a second beam-decelerating electric field can be realized between the second (projection-lens) liner tube and the wafer ($V_p-V_w$, or $V_p-0$).

Desirably, $|V_k|=|V_m|$. Under such conditions, it is possible to minimize the absolute values of the voltage supplied by a power supply to the cathode and of the voltage (supplied by a power supply) applied to the reticle, while maintaining a high beam energy at the reticle.

It is also desirable that the energy of electrons incident to the reticle be at least 120 keV, and that the energy of electrons incident to the wafer be no greater than 60 KeV. By keeping the velocity of electrons of the beam incident to the reticle high, electron absorption by the reticle is reduced. Such reduction in electron absorption by the reticle results in less reticle heating during irradiation of the reticle. Reduced reticle heating reduces thermal deformation of the reticle, thereby increasing the accuracy of pattern transfer. In a scattering contrast method, reduced reticle heating increases the imaging contrast. On the other hand, reducing the velocity of electrons of the beam incident to the wafer reduces decreases in resist sensitivity and reduces heating of the wafer due to irradiation of the wafer, thereby increasing the accuracy of pattern transfer.

Any remaining aberrations can be corrected using multiple deflectors or a stigmator as required, provided between the reticle and the wafer. This further increases the accuracy of pattern transfer.

It is further desirable that the beam incident to the wafer have a beam half-angle (angle of a tangent to a lateral edge of the beam at the wafer relative to the optical axis) of at least 10 mrad. Directly upstream of the surface of the wafer, the patterned beam desirably is decelerated in the optical axis direction due to the action of the decelerating electric field between the projection-optical system and the wafer. However, because the patterned beam is not being decelerated in directions perpendicular to the optical axis, the beam half-angle becomes progressively larger with decreasing axial distance to the wafer. However, as the patterned beam propagates axially through the projection lenses (which are situated at a significant distance from the wafer), because the diameter of the patterned beam is small, space charge effects tend to increase. Such space-charge effects can be maintained at an acceptable level if the beam half-angle of the patterned beam incident to the wafer is at least 10 mrad (or desirably 12 mrad or more).

A contrast aperture desirably is provided between the reticle and the wafer at an axial position at which the axial distance from the wafer to the contrast aperture divided by the axial distance from the reticle to the contrast aperture is equal to the demagnification ratio of the projection-optical system. The distribution of beam intensity within the contrast aperture is desirably such that the off-axis beam intensity is greater than on-axis beam intensity. Such a beam is termed a "hollow beam," which further reduces space-charge effects within the projection-optical system.

The decelerating electric field(s) between the reticle and the wafer reduces the velocity of the charged particle beam in regions in which such electric fields are present. However, such beam slowing in the projection-optical system can result in increased distortion of the beam from space-charge effects. To avoid such a consequence, a combination of corrective measures desirably are employed such as using a hollow beam and using a relatively large beam half-angle at the wafer.

Each liner tube desirably comprises a ceramic, axially extended, cylindrical body of which the ID surface is coated with a film made of an electrically conductive material that extends over the entire ID surface and end surfaces. The outside diameter (OD) surface of the body is coated with a film made of an electrically conductive material that extends over the entire OD surface. A high voltage is applied to the ID film, while the OD film desirably is at ground potential. Because the OD film is thus at zero potential, no special insulation is required between the liner tube and components situated radially outside of the tube (such as the magnetic pole or excitation coil of the respective lens). Also, no special insulation is required between the magnetic pole and excitation coil of the respective lens and any component radially external to the lens.

Between the reticle and the liner tube of the projection lens and/or between the liner tube of the projection lens and the wafer (within the deceleration electric field/fields, respectively), an aperture plate desirably is situated that extends transversely to the optical axis. The aperture plate defines an opening that is rotationally symmetrical about the optical axis. The aperture plate is used, inter alia, to adjust the tilt of the electric field relative to the optical axis. In addition, charged particles of the beam incident to the aperture plate can be detected for purposes of, e.g., evaluating the patterned beam or for detecting alignment marks on the wafer or wafer stage. The aperture plate also can reduce aberrations due to non-planarity of the surface around the reticle or wafer.

The foregoing and additional features and advantages of the invention will be more readily apparent from the following detailed description, which proceeds with reference to the accompanying drawings.

BRIEF DESCRIPTION OF THE DRAWINGS

FIG. 2 shows the decelerating electric field established between the reticle and the first liner tube, and the effect of that electric field on the patterned beam.

FIG. 3 shows the decelerating electric field established between the second liner tube and the wafer, and the effect of that electric field on the patterned beam.

DETAILED DESCRIPTION

Figure 1:
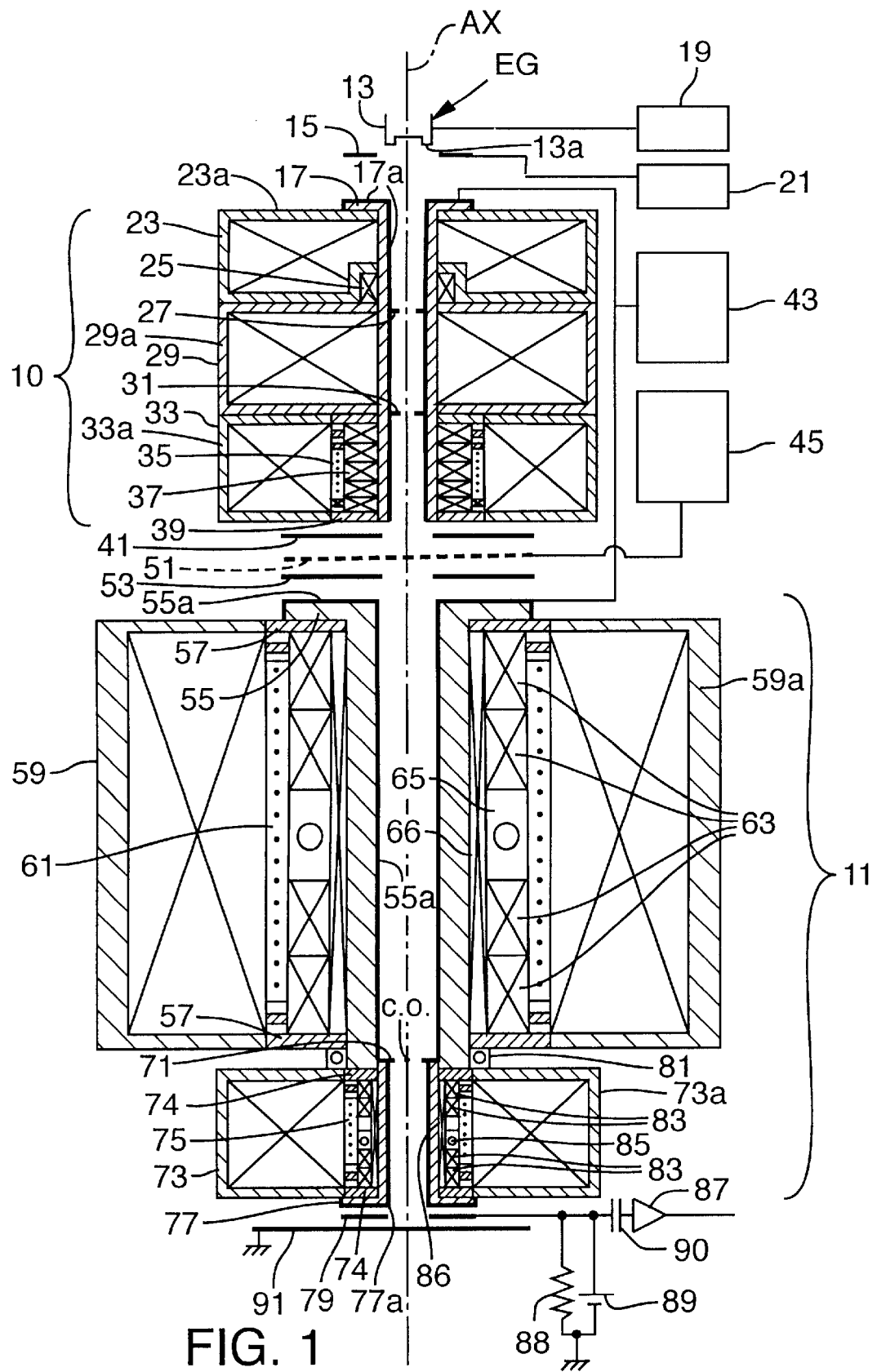
FIG. 1 is an elevational sectional view of the overall configuration of a charged-particle-beam (CPB) optical system as used in a CPB microlithography apparatus according to a representative embodiment of the present invention.

A representative embodiment of a charged-particle-beam (CPB) optical system according to the invention, and of a CPB microlithography apparatus, according to the invention, that comprises such an optical system, is depicted in FIG. 1. The following description of the FIG. 1 embodiment is in the context of an electron-beam system (as a representative CPB system according to the invention). However, it will be understood that the general principles of this embodiment can be applied with equal facility to use of an alternative charged particle beam (such as an ion beam).

The most upstream component of the FIG. 1 embodiment is an electron gun EG including a cathode 13. The cathode 13 in this embodiment has a ring-shaped electron-emitting surface 13a. A cathode power supply 19 is connected to the cathode 13 and applies to the cathode a high negative voltage $V_k$ (e.g., −60 KV). When so energized, the electron-emitting surface 13a emits a "hollow" electron beam that propagates in a downstream direction along an optical axis AX to a reticle 51. Although not shown, the electron gun EG forms a "gun crossover" of the electron beam just upstream of the first condenser lens 13.

A control anode 15 is situated downstream of the cathode 13. A power supply 21, connected to the control anode 15, applies a voltage to the control anode that is positive (i.e., less negative) with respect to the cathode voltage (e.g. −50 KV). The control anode 15 acts as an electrostatic lens for the electron beam emitted from the beam-emitting surface 13a of the cathode 13. The control anode can be used to adjust the axial position of the gun crossover.

The electron beam propagating from the cathode 13 to the reticle 51 is termed the "illumination beam." The illumination beam propagates through an "illumination-optical system" 10 that comprises various lenses and deflectors, as described below. As the illumination beam illuminates a desired region on the reticle 51, some of the particles in the beam pass through the illuminated region and thus acquire an ability to form a downstream image of the illuminated region. Thus, the electron beam propagating from the illuminated region on the reticle 51 to the substrate 91 (e.g., semiconductor wafer) is termed the "patterned beam." The patterned beam passes through a "projection-optical system" 11 that comprises two lenses and various deflectors, as described below. The optical system shown in FIG. 1 normally is contained in a vacuum chamber (not shown) in which the atmosphere can be evacuated as required.

The illumination-optical system 10 comprises, as arranged on the optical axis AX, a first condenser lens 23, a second condenser lens 29, and an illumination lens 33. The illumination-optical system is configured to illuminate a desired region on the reticle 51. (The reticle 51 typically is "divided" or "segmented" into multiple portions each defining a respective portion of the overall pattern defined by the reticle.) The illumination-optical system forms an image of the gun crossover at the region of the reticle being illuminated by the illumination beam. Since the lateral distribution of beam intensity at and near a crossover is "flat," i.e., constant in lateral directions from the optical axis, the illumination beam is a "solid" beam at the reticle 51.

Downstream of the control anode 15 and extending axially through the inside diameter (ID) of the first condenser lens 23, second condenser lens 29, and illumination lens 33 is a first liner tube 17. The first liner tube 17 serves as, inter alia, an additional anode. The first liner tube 17 is configured as a hollow cylinder with a collar at its upstream end. The first liner tube desirably is formed of a ceramic insulating material. The upstream surface of the collar as well as the ID surface of the first liner tube 17 are coated with an electrically conductive metal film 17a. Connected to the metal film 17a is a liner-tube power supply 43 that applies a high positive voltage (e.g., +40 KV) to the metal film 17a. By way of example, the body of the liner tube 17 is made of 2 mm-thick alumina (a ceramic), and the metal film 17a is produced by sputtering titanium onto the noted surfaces of the ceramic body to a thickness of 5 nm, followed by Pt to a thickness of 200 nm. The same coating can be applied to the outside diameter of the first liner tube. The coating on the outside diameter is connected to ground.

The metal film 17a on the upstream-facing surface of the liner tube 17 serves as the additional anode. In this example, the accelerating voltage between the cathode 13 and the metal film 17a is 40 KV−(−60 KV)=100 KV. The coating on the inside diameter of the liner tube prevents charging of the liner tube.

Each of the lenses 23, 29, 33 of the illumination-optical system 10 has a respective hollow, rotationally symmetrical, magnetic pole 23a, 29a, 33a, respectively. Each magnetic pole is configured to have a respective inward-facing C-shaped cross-section, and produces a respective magnetic-flux circuit for the respective lens. To such end, a respective excitation coil (denoted by the respective laterally opposing pair of large X's) is provided inside each magnetic pole 23a, 29a, 33a. The windings of each excitation coil encircle the optical axis AX as well as the first liner tube 17.

Situated inside the first liner tube 17, at the same "height" as the upstream portion of the magnetic pole 29a of the second condenser lens 29, is a beam-shaping aperture 27. Similarly, situated inside the first liner tube 17 (downstream of the beam-shaping aperture 27), at the same "height" as the upstream portion of the magnetic pole 33a of the illumination lens 33, is a blanking aperture 31. A blanking deflector 25 is situated inside the downstream part of the first condenser lens 23. When energized, the blanking deflector 25 laterally deflects the illumination beam sufficiently for the blanking deflector 25 to block downstream propagation of the illumination beam.

Situated axially along the inside diameter of the illumination lens 33 is a ferrite stack 35, and situated axially along the inside diameter of the ferrite stack 35 is an illumination-beam deflector array 37. The ferrite stack 35 is an axially extended "stack" of alternating rings of ferrite and an electrical insulator material. The ferrite stack 35 acts as a shield to prevent the high-frequency magnetic field produced by the illumination-beam deflector array 37 from "leaking" radially outward from the deflector array 37. The illumination-beam deflector array 37 is situated around the outside diameter of the first liner tube 17 and comprises multiple (e.g., five) deflectors arranged along the optical-axis direction (each deflector being indicated by a separate laterally opposing pair of "X"s). A ferrite magnetic pole piece 39 is placed on each axial end of the illumination-beam deflector array 37 in the core of the magnetic pole 33a of the illumination lens 33.

Operation of the illumination-optical system is as follows. As noted above, an image of the flat area around the gun crossover (of the electron beam propagating from the electron-emitting surface 13a of the cathode 13) is formed on the beam-shaping aperture 27 by the first condenser lens 23. The beam-shaping aperture 27 defines the outer profile of the illumination beam to a size and shape sufficient to illuminate one "exposure unit" (e.g., a subfield) on the reticle 51. (An exposure unit is a region on the reticle that can be illuminated by the illumination beam at any one instant, and measures, e.g., 1 mm square on the reticle.) Whenever it is desired not to irradiate the reticle 51, the blanking deflector 25 deflects the illumination beam to strike the aperture plate of the blanking aperture 31, thus blocking propagation of the illumination beam downstream of the blanking aperture.

The second condenser lens 29 forms an image of the cathode at the position of the blanking aperture 31. The illumination lens 33 forms an image of the beam-shaping aperture 27 on the illuminated region (exposure unit) of the reticle 51 and also collimates the illumination beam. The illumination-beam deflector array 37 deflects the illumination beam at high speed as required within a plane perpendicular to the optical axis AX. Such lateral deflection allows sequential illumination, in a prescribed order, of the exposure units on the reticle 51. Alternatively, a large area of the reticle (larger than the field of view of the illumination-optical system 10 and projection-optical system 11) can be exposed by synchronously scanning a "reticle stage" (not shown, but on which the reticle 51 is mounted) and a "wafer stage" (not shown, but on which the wafer 91 is mounted).

Downstream of the illumination lens 33 is the reticle 51, sandwiched between upstream and downstream aperture plates 41, 53, respectively.

As noted above, the reticle 51 defines the pattern to be transferred to the wafer 91. Two types of reticles normally are used in CPB microlithography. The first type is termed a "stencil reticle" in which pattern features are defined by corresponding voids (openings) extending through the thickness dimension of a reticle membrane (e.g., silicon membrane). The second type is termed a "scattering-membrane reticle" in which pattern features are defined by corresponding voids (openings) in an electron-scattering layer (e.g., tantalum or tungsten) applied to a reticle membrane (e.g., silicon). In a scattering-membrane reticle, electrons in the illumination beam pass with at most slight scattering through regions of the reticle membrane lacking the scattering layer. Such electrons propagate on to the wafer 91 to expose corresponding regions of a resist layer applied to the upstream-facing surface of the wafer 91.

The velocity of electrons in the illumination beam incident on the reticle is high. Nevertheless, apparatus according to the invention can be used with either type of reticle.

Connected to the reticle 51 is a reticle power supply 45 that applies a high positive voltage (e.g., 60 KV) to the reticle. By way of example, the beam-acceleration potential difference between the cathode of the electron gun EG and the reticle 51 is +60 KV−(−60 KV)=120 KV. In such an example, the potential difference between the reticle 51 and the first liner tube 17 is +60 KV−40 KV=20 KV.

The upstream aperture plate 41 (located between the illumination lens 33 and the reticle 51) is configured as a thin metal sheet defining an axial opening through which the illumination beam passes. The voltage applied to the upstream aperture plate 41 desirably is sufficient for the aperture plate 41 to be at the same potential as the reticle 51. (By keeping the potentials the same, deleterious effects of any non-planarity around the reticle are minimized.) The purpose of the upstream aperture plate 41 is to reduce aberrations due to planarity deviations around the reticle. (The aperture plate 41 limits the extent and effects of corresponding variations of the potential at the reticle caused by the deviations from planarity around the reticle.)

The downstream aperture plate 53 is located just downstream of the reticle 51. The downstream aperture plate 53 desirably is configured identically to, has the same potential as, and performs the same function as the upstream aperture plate 41.

As noted above, the projection-optical system 11 is situated on the optical axis AX between the reticle 51 and the wafer 91. The projection-optical system 11 comprises a two-stage projection-lens assembly including a first projection lens 59 and a second projection lens 73. The first and second projection lenses 59, 73 produce a "reduced" or "demagnified" image of the illuminated region of the reticle on the surface of the wafer 91. By "reduced" or "demagnified" is meant that the image as formed on the wafer 91 is smaller, usually by a reciprocal integer factor termed the "demagnification ratio," than the size of the corresponding illuminated region on the reticle 51. An exemplary demagnification factor is ¼ or ⅕. As each exposure unit on the reticle 51 is illuminated, the projection lenses 59, 73 form an image of the exposure units on corresponding locations on the surface of the wafer 91.

Each of the projection lenses 59, 73 includes a respective hollow, rotationally symmetrical, magnetic pole 59a, 73a with an inward-facing C-shaped cross-section. The magnetic poles 59a, 73a constitute respective magnetic-flux circuits for the respective projection lenses 59, 73. Inside each magnetic pole 59a, 73a is a respective excitation coil comprising a winding around the optical axis AX. Each winding is denoted in FIG. 1 as a respective laterally opposing pair of large "X"s.

Each of the projection lenses 59, 73 has a respective ID in which is fitted a respective liner tube 55, 77. Each liner tube 55, 77 is configured as a hollow cylinder with a collar at the upstream end of the liner tube 55 and a collar at the downstream end of the liner tube 77. The body of each liner tube desirably is made of a ceramic material that is an electrical insulator. The ID and upstream-facing surfaces of the first liner tube 55 are coated with an electrically conductive metal film 55a (such as 5 nm Ti followed by 200 nm Pt). Similarly, the ID and downstream-facing surfaces of the second liner tube 77 are coated with an electrically conductive metal film 77a (such as 5 nm Ti followed by 200 nm Pt). The metal films 55a and 77a are connected to a liner-tube power supply 43 that applies a high positive voltage (e.g., +40 KV) to each of the liner tubes 55, 77. The outside-diameter surface of each liner tube 55, 77 is coated (desirably with the same electrically conductive metal film as the inside-diameter surfaces). The coatings prevent charging of the respective surfaces.

The projection-optical system 11 also includes a contrast aperture 71 desirably situated inside the downstream end of the first liner tube 55. The contrast aperture 71 is situated at an axial location at which the axial distance from the contrast aperture 71 to the wafer 91 divided by the axial distance from the reticle 51 to the contrast aperture 71 is equal to the demagnification ratio of the projection-optical system 11. The axial position of the contrast aperture 71 is also where an image of the cathode would be formed. The contrast aperture 71 blocks downstream propagation of electrons scattered by non-patterned portions of the reticle 51.

The magnetic pole 59a of the first projection lens 59 includes pole pieces 57, one located on the upstream end of the first projection lens 59 and the other location on the downstream end of the first projection lens 59. Situated inside the ID of the excitation coil 59a and between the pole pieces 57 is a ferrite stack 61 comprising an alternating "stack" of electrically insulating rings (such as non-magnetic ferrite) and ferrite rings. The ferrite stack 61 acts as a shield to prevent the high-frequency magnetic field generated by deflectors arrayed along the ID of the ferrite stack 61 from "leaking" radially outward. Each of the pole pieces 57 is configured with an ID (bore diameter) that is smaller than the ID of the ferrite stack 61.

Along the ID of the ferrite stack 61 is an aberration-correction deflector array 63, a stigmator 65, and a multi-function coil 66. The multi-function coil 66 functions as a dynamic focus coil (for adjusting the focus of the first projection lens 59 as required) and a "correction" coil for correcting the demagnification ratio and rotation of the patterned beam as required. For more specific information concerning the aberration-correction deflector array 63, reference is made to Hosokawa, "Systematic Elimination of. Third-Order Aberrations in Electron Beam Scanning," Optik 56(1):21–30, 1980. The stigmator 65 is a coil assembly normally used for correcting beam astigmatism as required.

The second projection lens 73 is basically an inverted, size reduced (by the demagnification ratio) counterpart to the first projection lens 59. The first and second projection lenses 59, 73, respectively, are configured relative to each other to satisfy symmetrical magnetic doublet (SMD) conditions. I.e., the first and second projection lenses 59, 73 are configured to have respective bore diameters, respective axial distances between pole pieces, and respective axial distances from the crossover C.O. to the respective pole pieces that are integer ratios of each other. The ratios of dimensions of the second projection lens 73 to corresponding dimensions of the first projection lens 59 are equal to the demagnification ratio.

As in the first projection lens 59, the second projection lens 73 has an inside diameter (ID) in which an axially coextensive ferrite stack 75 is situated. The ferrite stack 75 has a structure and function that is analogous to the structure and function, respectively, of the ferrite stack 61 described above. Axially along the ID of the ferrite stack 75 is situated an aberration-correction deflector array 83 (having the same function as the deflector array 63), a stigmator 85 (having the same function as the stigmator 65), and a multi-function coil 86. The multi-function coil 86 serves, inter alia, as a dynamic focus coil and also to correct the demagnification ratio and rotation of the image formed by the projection-optical system 11. The array 63 of aberration-correction deflectors and coils 65, 66 inside the ID of the first projection lens 59, and corresponding array 83 of aberration-correction deflectors and coils 85, 86 inside the ID of the second projection lens 73 are situated in point-symmetrical positions, according to the demagnification ratio, about the crossover C.O. Each pair of deflectors and coils (i.e., each pair consisting of a deflector or coil in the first projection lens 59 and the corresponding deflector or coil in the second projection lens 73) is connected in series to a respective power supply (not shown).

In the projection-optical system of the FIG. 1 embodiment, a stigmator 81 is situated at the axial position of the contrast aperture 71 between the first projection lens 59 and the second projection lens 73. The operation of the stigmator 81 will be described later.

In this embodiment, the wafer 91 is electrically grounded, helping to form a decelerating electric field of $V_P-0=40$ KV (by way of example) between the wafer 91 and the metal film 77a on the downstream-facing surface of the second liner tube 77. The action of this decelerating electric field will be described later with reference to FIG. 3.

An aperture plate 79 (defining an axial opening) is situated between the second projection lens 73 and the wafer 91. The aperture plate 79 desirably is configured as a thin metal sheet defining an axial, rotationally symmetrical opening. The aperture plate 79 has a function similar to the function of the aperture plate 41, except that the aperture plate 79 limits the extent and effects of corresponding variations of the potential of the wafer 91 caused by deviations from planarity around the wafer 91. The aperture plate 79 is connected via a resistor 88 and a positive bias 89 to ground, and via a capacitor 90 to the input of an amplifier 87. The capacitor is used to block the d.c. voltage component of detector bias to the amplifier 87. The amplifier 87 amplifies the electrical signal across the ends of the resistor to allow the aperture plate 79 to be used for detecting secondary electrons and backscattered electrons from the wafer 91. The resulting detection signal from the amplifier 87 can be used to evaluate the patterned beam and its axial alignment, etc., or for detection of alignment marks on the wafer 91 or wafer stage.

The decelerating electric fields produced by the projection-optical system are now described. By way of example, between the reticle 51 and the first liner tube 55 (specifically, the upstream-facing metal-film surface 55a of the first liner tube 55) is a decelerating electric field of 60 KV−40 KV=20 KV. The action of this decelerating electric field will be described later with reference to FIG. 2.

Formed on the ID surface of the first liner tube 55 in the first projection lens 59 and on the ID surface of the second liner tube 77 in the second projection lens 73 are metal films 55a and 77a, respectively. The metal films 55a, 77a are connected electrically to each other as described above. As a result, no electric fields exist inside the respective bores of the first projection lens 59 and the second projection lens 73.

In this embodiment, a voltage of +20 KV normally is applied to the aperture plate 79. The respective magnitudes of lens aberrations parasitic to the electric field between the second projection lens 73 and the wafer 91 can be changed (increased or decreased as required) by adjusting the voltage applied to the aperture plate 79 and/or by changing the diameter of the axial opening defined by the aperture plate 79. Aberrations can be adjusted, for example, by concentrating on symmetry, paying especial attention to the diameter of the opening defined by the aperture plate 79 and/or the symmetry of the axial position of the aperture plate 79. More specifically, the magnitudes of respective negative aberrations can be adjusted by adjusting the focal length of an electrostatic "lens" (see below) formed between the second projection lens 73 and the aperture plate 79, and the surface of the wafer 91. (Whenever the potential difference between the liner tube and the aperture plate is increased, the focal length of the electrostatic lens is decreased.) Also, aberrations due to a non-planarity of the surface around the wafer can be reduced by setting the voltage applied to the aperture plate 79 such that the aperture plate 79 and the chamber (not shown) are at the same electrical potential, and by reducing the diameter of the axial opening defined in the aperture plate 79.

The following provides a more detailed description of the action of the decelerating electric fields imposed between the reticle 51 and the projection-optical system 11, and between the projection-optical system 11 and the wafer 91.

Figure 2:
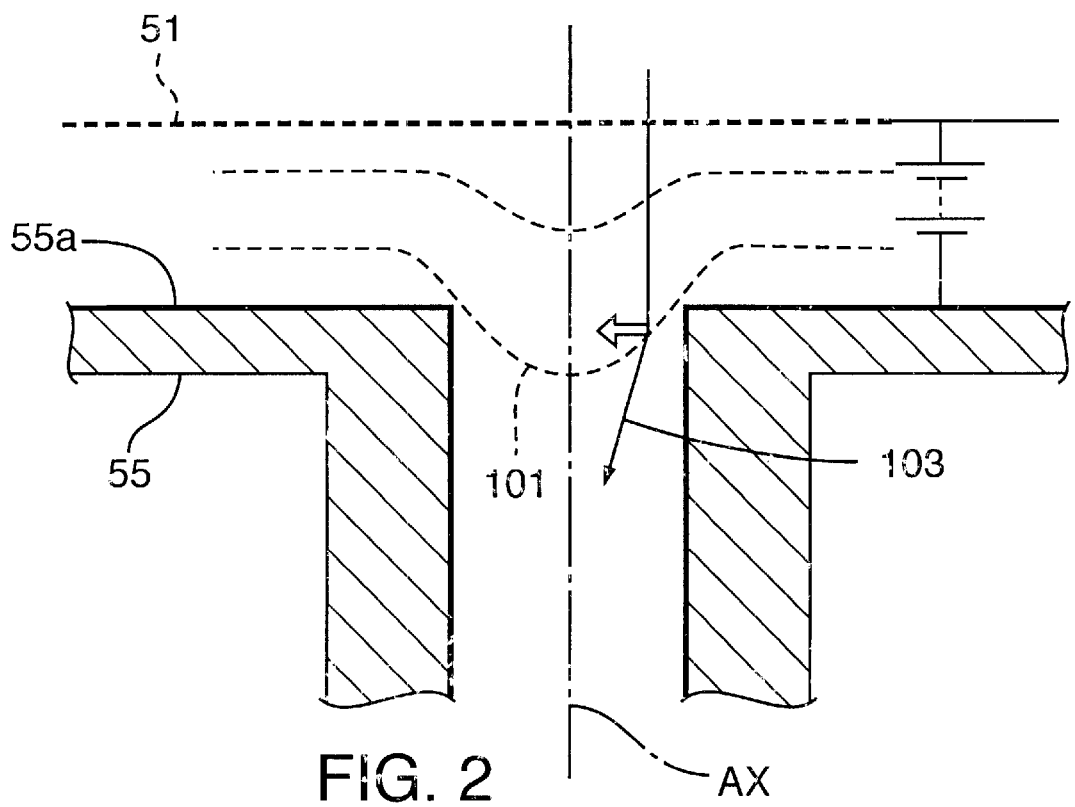
FIG. 2 is an elevational sectional view of the upstream end of the first liner tube of the first projection lens of the FIG. 1 embodiment.

FIG. 2 depicts certain features of a first decelerating electric field situated between the reticle 51 and the liner tube 55 of the first projection lens 59, and illustrates an action of that electric field. The decelerating electric field can be depicted by equipotential planes (schematically indicated by dashed lines between the reticle 51 and the liner tube 55). As shown in FIG. 2, the equipotential planes 101 of the electric field protrude in a downstream direction. Such protrusion causes the trajectory (arrow 103) of an electron of the patterned beam to be refracted toward the optical axis AX. In other words, the portion of the decelerating electric field characterized by the downstream-projected equipotential planes 101 exhibits a convex lens action on the patterned beam, and hence can be regarded as a first electrostatic "lens."

Figure 3:
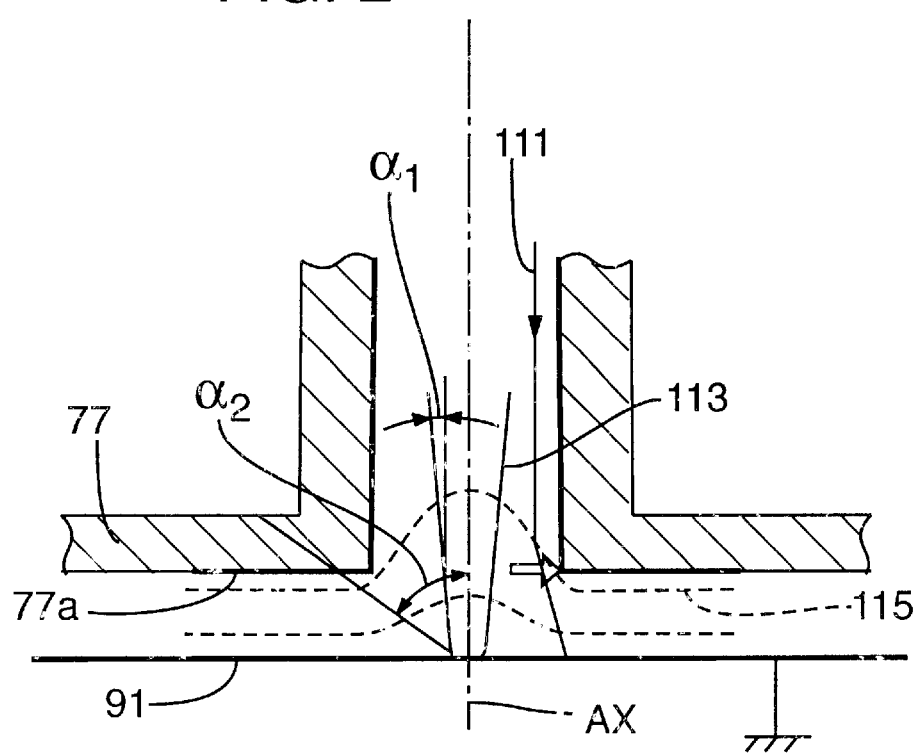
FIG. 3 is an elevational sectional view of the downstream end of the second liner tube of the second projection lens of the FIG. 1 embodiment.

FIG. 3 depicts certain features of a second decelerating electric field situated between the liner tube 77 of the second projection lens 73 and the wafer 91, and illustrates an action of that electric field. Again, the decelerating electric field can be depicted by equipotential planes (schematically indicated by dashed lines between the liner tube 77 and the wafer 91). As shown in FIG. 3, the equipotential planes 115 of the electric field protrude in an upstream direction. Such protrusion causes the trajectory (arrow 111) of an electron of the patterned beam to be refracted away from the optical axis AX. In other words, the portion of the decelerating electric field characterized by the upstream-projected equipotential planes 115 exhibits a concave lens action on the patterned beam, and hence can be regarded as a second electrostatic "lens."

The first (convex) and second (concave) electrostatic lenses acting in concert effectively serve to reduce aberrations. Any remaining aberrations not corrected by the first and second electrostatic lenses can be corrected by the respective deflector arrays 63, 83 in the first and second projection lenses 59, 73, respectively.

Also, linear distortion of projected subfield images can be corrected by adjusting the demagnification ratio in directions transverse to the optical axis. Such adjustments can be made by appropriate energizations of constituent coils of the stigmators 65, 85 situated at mid-length (along the optical axis AX) of the respective projection lenses 59, 73. Also, astigmatism that degrades beam resolution can be corrected effectively by appropriately energizing the stigmator 81 situated at the crossover aperture 71. I.e., the stigmator 81 can be energized to create a countervailing astigmatism in a lateral direction opposite the direction of the problem astigmatism.

The respective beam half-angles of the patterned beam in the second projection lens 77 and directly upstream of the wafer 91 are now described with reference to FIG. 3. In the proximity of the wafer 91, the incident patterned beam 113 is decelerated in the optical-axis direction but not in the radial direction (directions transverse to the optical axis). Thus the patterned beam 113 in this location has a small beam half-angle $\alpha_1$ as the beam passes through the second projection lens 77. ($\alpha_1$ is the ratio of the beam radius at the principal plane of the second projection lens 77 relative to the focal length of the second projection lens 77.) However, the patterned beam 113 has a relatively large beam half-angle $\alpha_2$ at the surface of the wafer 91. Along most of the trajectory of the patterned beam through the projection-optical system 11, then, the beam half-angle is the relatively small $\alpha_1$ value. Since the diameter of the patterned beam in this region is also small, the space-charge effect in this region can be correspondingly large. If the beam half-angle $\alpha_2$ is at least 10 mrad or 12 mrad immediately upstream of the wafer surface, then space-charge effects can be reduced substantially compared to the conventional case where the beam half-angle is smaller than 8 mrad.

Space-charge effects can be reduced even further by configuring the patterned beam as a "hollow beam" for propagation through the projection-optical system 11. In this embodiment, a hollow beam is produced by forming, on the contrast aperture 71, an image of the ring-shaped electron-emitting surface 13a of the cathode 13 of the electron gun EG. With such a beam, the beam half-angle $\alpha_2$ would be, for example, up to 15 mrad for the inside diameter, and up to 20 mrad for the outside diameter.

As described above, in this embodiment, with −60 KV applied to the cathode 13 and +60 KV applied to the reticle 51, the beam energy incident to the reticle 51 is 120 KV. Under such conditions, the amount of beam energy absorbed by the reticle is small, and reticle heating is minimal. Also because the difference in potential between the cathode 13 and electrical ground, and between the reticle 51 and ground, is only 60 KV, a low-cost power and high-precision supply can be used, with a correspondingly reduced probability of inadvertent arcing.

Therefore, according to the present invention, apparatus are provided in which the velocity of the charged-particle patterned beam incident to the wafer is caused to be less than the velocity of the charged-particle illumination beam incident to the reticle. Hence, it is possible to suppress aberrations that are parasitic to the lens action of a decelerating electrical field situated between the reticle and the wafer.

Figure 4:
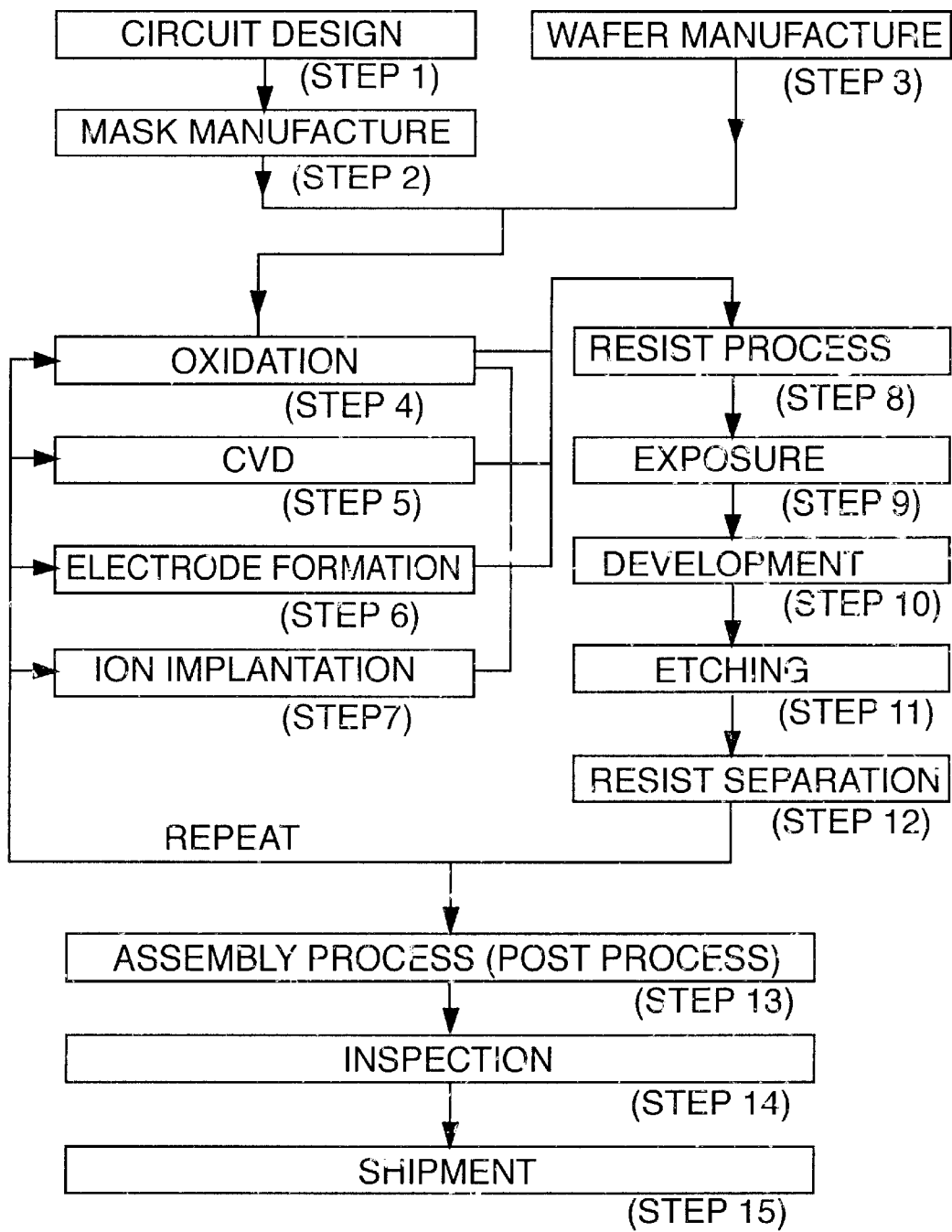
FIG. 4 is a flow chart for manufacturing a semiconductor device, wherein the process includes a microlithography method according to the invention.

FIG. 4 is a flow chart of steps in a process for manufacturing a semiconductor device such as a semiconductor chip (e.g., an integrated circuit or LSI device), a display panel (e.g., liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has been passed through steps 4–12 is formed into semiconductor chips. This step can include, e.g., assembling the devices (dicing and bonding) and packaging (encapsulation of individual chips). Step 14 is an inspection step in which any of various operability and qualification tests of the device produced in step 13 are conducted.

Afterward, devices that successfully pass step 14 are finished, packaged, and shipped (step 16).

Steps 4–12 also provide representative details of wafer processing. Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ion-implantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are superposedly formed on the wafer.

Whereas the invention has been described above in connection with a representative embodiment, it will be understood that the invention is not limited to that embodiment. On the contrary, the invention is intended to encompass all modifications, alternatives, and equivalents as may be included within the spirit and scope of the invention as defined by the appended claims.

What is claimed is:

1. A charged-particle-beam (CPB) optical system for use in a CPB microlithography apparatus, the CPB optical system comprising along an optical axis:

an illumination-optical system situated and configured to receive an illumination charged particle beam from a CPB source and direct the illumination beam to a region on a reticle, defining a pattern to be microlithographically transferred to a substrate, so as to illuminate the region on the reticle and produce a patterned beam propagating downstream of the illuminated region on the reticle;

a projection-optical system situated and configured to receive the patterned beam from the illuminated region on the reticle and to project the patterned beam to a respective region on the substrate;

a first beam-decelerating electric field situated between the reticle and the projection-optical system; and a second beam-decelerating electric field situated between the projection-optical system and the substrate.

2. The CPB optical system of claim 1, wherein:

the first and second beam-decelerating electric fields impose respective lens actions to the patterned beam; and the respective lens actions are opposite each other.

3. The CPB optical system of claim 1, wherein:

the first beam-decelerating electric field is configured to impose a convex lens action to the patterned beam;

the second beam-decelerating electric field is configured to impose a concave lens action to the patterned beam; and the first and second beam-decelerating electric fields are further configured such that respective aberrations arising from the convex lens action and respective aberrations arising from the concave lens action at least partially cancel each other.

4. The CPB optical system of claim 3, further comprising at least one of an array of multiple deflectors and a stigmator situated between the reticle and the substrate, wherein an aberration not cancelled by the first and second beam-decelerating electric fields is corrected by the deflector array or stigmator.

5. The CPB optical system of claim 1, wherein the patterned beam incident to the substrate has a beam half-angle of at least 10 mrad.

6. The CPB optical system of claim 1, further comprising a CPB source configured to generate a hollow charged particle beam.

7. The CPB optical system of claim 1, further comprising an aperture plate extending transversely to the optical axis and defining an aperture that is rotationally symmetrical about the optical axis, the aperture plate being situated in a beam-decelerating electric field.

8. A charged-particle-beam (CPB) microlithography apparatus, comprising on an optical axis:

a CPB source configured to generate an illumination charged particle beam;

an illumination-optical system situated and configured to receive the illumination beam from the CPB source and direct the illumination beam to a region on a reticle, defining a pattern to be microlithographically transferred to a substrate, so as to illuminate the region on the reticle and produce a patterned beam propagating downstream of the illuminated region on the reticle;

a projection-optical system situated and configured to receive the patterned beam from the illuminated region on the reticle and to project, by producing a field imposing a convex lens action to the patterned beam, the patterned beam to a respective region on the substrate;

a first beam-decelerating electric field situated between the projection-optical system and the substrate, and configured to impose a concave lens action to the patterned beam, the first beam-decelerating electric field and the field produced by the projection-optical system being further configured such that respective aberrations arising from the concave lens action and respective aberrations arising from the convex lens action at least partially cancel each other;

a contrast aperture situated between the reticle and the substrate, the contrast aperture being axially situated such that an axial distance from the substrate to the contrast aperture divided by an axial distance from the contrast aperture to the reticle is equal to a demagnification ratio of the projection-optical system; and the illumination optical system and the projection-optical system being configured to produce a lateral beam-intensity distribution of the patterned beam, the lateral beam-intensity distribution at the contrast aperture exhibiting an off-axis beam intensity that is greater than an on axis beam intensity of the distribution.

9. The apparatus of claim 8, further comprising at least one deflector and a stigmator situated between the reticle and the substrate, wherein an aberration not canceled by the field produced by the projection-optical system and the first beam-decelerating electric field is corrected by the deflector and the stigmator.

10. The apparatus of claim 8, further comprising a second beam-decelerating electric field situated between the reticle and the projection-optical system, the second beam-decelerating electric field being configured to impose a convex lens action to the patterned beam the first and second beam-decelerating electric fields being further configured such that respective aberrations arising from the concave lens action and respective aberrations arising from the convex lens action at least partially cancel each other.

11. The apparatus of claim 10, further comprising at least one of an array of multiple deflectors and a stigmator situated between the reticle and the substrate, wherein an aberration not cancelled by the first and second beam-decelerating electric fields is corrected by the deflector array or stigmator.

12. The apparatus of claim 10, wherein:
the projection-optical system comprises a first projection lens including a magnetic pole that is rotationally symmetric about the optical axis, an excitation coil situated within the magnetic pole, and a liner tube situated within an inside diameter of the magnetic pole and excitation coil; and
a voltage difference is established between the liner tube and the reticle and between the liner tube and the substrate, for forming the first and the second beam-decelerating electric fields, respectively.

13. The apparatus of claim 8, further comprising an aperture plate extending transversely to the optical axis and defining an aperture that is rotationally symmetrical about the optical axis, the aperture plate being situated in a beam-decelerating electric field, wherein the CPB source is configured to generate a hollow charged particle beam.

14. The apparatus of claim 8, wherein:
the CPB source is an electron gun;
the illumination beam and patterned beam are electron beams;
the illumination-optical system comprises a lens including a magnetic pole that is rotationally symmetric about the optical axis, an excitation coil situated within the magnetic pole, and a liner tube situated within an inside diameter of the magnetic pole and excitation coil; and
the projection-optical system comprises a first projection lens including a magnetic pole that is rotationally symmetric about the optical axis, an excitation coil situated within the magnetic pole, and a liner tube situated within an inside diameter of the magnetic pole and excitation coil.

15. The apparatus of claim 14, wherein:
the electron gun comprises a cathode to which a high negative voltage ($V_k$) is applied;
a high positive voltage ($V_i$) is applied to the liner tube of the lens of the illumination-optical system;
a high positive voltage ($V_m$), wherein $V_m \geq V_i$, is applied to the reticle;
a positive voltage ($V_p$), wherein $V_p < V_i$, is applied to the liner tube of the first lens of the projection-optical system; and
the substrate is either electrically grounded or charged with a voltage ($V_w$), wherein $V_w < V_p$.

16. The apparatus of claim 15, wherein $|V_k|=|V_m|$.

17. The apparatus of claim 14, wherein each liner tube comprises a body made of a ceramic, and a film made of an electrically conductive material extending over an inside-diameter surface of the body and an end surface of the body, the film being energized with a high voltage.

18. The apparatus of claim 17, further comprising an aperture plate situated axially within a beam-decelerating electric field between the reticle and the liner tube of the projection or between the liner tube of the projection lens and the substrate, the aperture plate defining an axial rotationally symmetrical opening.

19. The apparatus of claim 18, wherein charged particles of the charged particle beam incident to the aperture plate are detected.

20. The apparatus of claim 8, wherein:
the CPB source is an electron gun;
the illumination beam and patterned beam are electron beams;
the illumination beam impinging on the reticle comprises electrons having an energy of at least 120 KeV; and
the patterned beam impinging on the substrate comprises electrons having an energy of no greater than 60 KeV.

21. The apparatus of claim 8, wherein the patterned beam incident to substrate has a beam half-angle of at least 10 mrad.

22. In a charged-particle-beam microlithography method in which a charged-particle illumination beam from a charged-particle-beam source is directed by an illumination-optical system to illuminate a region on a reticle, so as to illuminate the region on the reticle and produce a patterned beam, and the patterned beam is directed by a projection optical system onto a respective region on a substrate to form an image of the illuminated reticle region on the, respective region on the substrate, a method for decelerating the patterned beam relative to the illumination beam, comprising:
providing a first beam-decelerating electric field between the reticle and the projection-optical system;
providing a second beam-decelerating electric field between the projection-optical system and the substrate, wherein the first and second beam-decelerating electric fields impose respective lens actions to the patterned beam, and the respective lens actions are opposite each other.

23. The method of claim 22, wherein aberrations parasitic to the first lens action are at least partially cancelled by aberrations parasitic to the second lens action.

24. The method of claim 22, wherein the first beam-decelerating electric field imposes a convex lens action to the patterned beam, and the second beam-decelerating electric field imposes a concave lens action to the patterned beam.

25. The method of claim 22, further comprising the steps of:
providing the illumination-optical system with a lens having a magnetic pole that is rotationally symmetric about an optical axis, an excitation coil situated within the magnetic pole, and a liner tube situated within an inside diameter of the magnetic pole; and
providing the projection-optical system with a projection lens having a magnetic pole that is rotationally symmetric about the optical axis, an excitation coil situated within the magnetic pole, and a liner tube situated within the inside diameter of the magnetic pole.

26. The method of claim 25, wherein the CPB source is an electron gun, the method further comprising the steps of:
applying a high negative voltage ($V_k$) to a cathode of the electron gun;
applying a high positive voltage ($V_i$) to the liner tube of the lens of the illumination-optical system;
applying a high positive voltage ($V_p$), wherein $V_p < V_i$, to the reticle;
applying a high positive voltage ($V_m$), wherein $V_m \geq V_i$, to the liner tube of the projection lens of the projection-optical system; and
applying to the substrate either a ground potential or a voltage ($V_w$), wherein $V_w < V_p$.

27. The method of claim 26, wherein $|V_k|=|V_m|$.

28. The method of claim 26, wherein:
electrons of the illumination beam as incident on the reticle have an energy of at least 120 KeV; and
electrons of the patterned beam as incident on the substrate have an energy of no greater than 60 KeV.

29. The method of claim 26, including the step of providing the patterned beam as incident on the substrate with a beam half-angle of at least 10 mrad.

30. A semiconductor-fabrication process, comprising the steps of:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (ii) comprises providing a charged-particle-beam projection-exposure apparatus as recited in claim 8; and using the charged-particle-beam projection-exposure apparatus to expose the resist with the pattern defined on the reticle.

31. A semiconductor device produced by the method of claim 30.

32. A semiconductor-fabrication process, comprising the steps of:
(a) preparing a wafer;
(b) processing the wafer; and
(c) assembling devices formed on the wafer during steps (a) and (b), wherein step (b) comprises a method for performing microlithography as recited in claim 22.

33. A semiconductor device produced by the method of claim 32.

* * * * *

UNITED STATES PATENT AND TRADEMARK OFFICE
CERTIFICATE OF CORRECTION

PATENT NO.    : 6,429,441 B1                                        Page 1 of 1
DATED         : August 6, 2002
INVENTOR(S)   : Nakasuji It is certified that error appears in the above-identified patent and that said Letters Patent is hereby corrected as shown below:

Column 11,
Line 61, "$\alpha$," should be -- $\alpha_1$ --.

Column 12,
Line 25, "cathode 25 13" should be -- cathode 13 --.

Signed and Sealed this

Fifteenth Day of July, 2003

JAMES E. ROGAN
*Director of the United States Patent and Trademark Office*